(12) United States Patent
Herner

(10) Patent No.: US 7,537,968 B2
(45) Date of Patent: May 26, 2009

(54) JUNCTION DIODE WITH REDUCED REVERSE CURRENT

(75) Inventor: S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 1 day.

(21) Appl. No.: 11/765,254

(22) Filed: Jun. 19, 2007

(65) Prior Publication Data

US 2008/0318397 A1    Dec. 25, 2008

(51) Int. Cl.
     *H01L 21/82*    (2006.01)
(52) U.S. Cl. .................. 438/131; 438/483; 257/E21.09; 257/E21.358
(58) Field of Classification Search .................. 438/131, 438/239, 257–267, 132, 483; 257/74, 296, 257/E21.422, E21.09, E21.358
See application file for complete search history.

(56) References Cited

U.S. PATENT DOCUMENTS

| | | | |
|---|---|---|---|
| 6,185,122 B1 * | 2/2001 | Johnson et al. | 365/103 |
| 6,881,994 B2 * | 4/2005 | Lee et al. | 257/296 |
| 6,952,030 B2 | 10/2005 | Herner et al. | |
| 7,224,013 B2 | 5/2007 | Herner et al. | |
| 2005/0012154 A1 | 1/2005 | Herner et al. | |
| 2005/0052915 A1 | 3/2005 | Herner et al. | |
| 2006/0073657 A1 * | 4/2006 | Herner et al. | 438/237 |
| 2006/0087005 A1 | 4/2006 | Herner et al. | |
| 2006/0249753 A1 | 11/2006 | Herner et al. | |
| 2007/0004109 A1 | 1/2007 | Ichijo et al. | |

OTHER PUBLICATIONS

Girginoudi, S., et al., "Electrical and Structural Properties of Poly-Si Films Grown by Furnace and Rapid Thermal Annealing of Amorphous Si," (1998), Journal of Applied Physics 84(4), pp. 1968-1972.

* cited by examiner

*Primary Examiner*—Brook Kebede
(74) *Attorney, Agent, or Firm*—Foley & Lardner LLP

(57) ABSTRACT

A method for annealing a diode formed of a silicon-germanium alloy that minimizes leakage current is disclosed. The method includes the steps of forming semiconductor pillars of an alloy of silicon and germanium; heating the pillars at a first temperature for at least 30 minutes, and then heating the pillars at a second temperature higher than the first temperature of the alloy for up to 120 seconds. The invention further includes a monolithic three dimensional memory array of a plurality of p-i-n diodes, the p-i-n diodes being formed of a silicon-germanium alloy that have been subjected to a two-stage heating process.

27 Claims, 6 Drawing Sheets

US 7,537,968 B2

JUNCTION DIODE WITH REDUCED REVERSE CURRENT

RELATED APPLICATIONS

This application is related to Herner et al., U.S. patent application Ser. No. 11/765,274, "Method to Form Highly Scalable Thin Film Transistor"; and to Herner et al., U.S. patent application Ser. No. 11/765,269, "Highly Scalable Thin Film Transistor", both filed on even date herewith and hereby incorporated by reference in their entirety.

BACKGROUND OF THE INVENTION

The invention relates to a junction diode comprising semiconductor alloys. Some devices, as in Herner et al., U.S. patent application Ser. No. 10/326,470, "An Improved Method for Making High Density Nonvolatile Memory," filed Dec. 19, 2002, (hereinafter the '470 application), which is hereby incorporated by reference, employ a vertically oriented semiconductor junction diode. Dopant types and levels may be varied throughout the diode, but the entire diode is formed of a single semiconductor or semiconductor alloy.

The present application pursues other methods of preparing a junction diode to improve device performance. In general, silicon-germanium diodes can provide higher forward and reverse currents than comparable silicon diodes as taught in the '470 application. It is preferable to minimize the reverse current and maximize the forward current.

SUMMARY OF THE PREFERRED EMBODIMENTS

The present invention is defined by the following claims, and nothing in this section should be taken as a limitation on those claims. In general, the invention is directed to a method to anneal an amorphous film formed of a silicon-germanium alloy. More particularly, the invention is directed to method of making a p-i-n diode of $Si_{1-x}Ge_x$. Such a diode may be used in a memory cell, for example in a monolithic three dimensional memory array.

A first aspect of the invention provides for a method for forming a junction diode, the method comprising: a) forming semiconductor pillars, the pillars comprising an amorphous alloy of silicon and germanium; b) heating said pillars at a first temperature for at least 30 minutes; and c) heating said pillars at a second temperature, wherein the second temperature is higher than the first temperature, for about 120 seconds or less.

An embodiment of the invention provides for a method for forming a monolithic three dimensional memory array, the method comprising: a) forming semiconductor pillars comprising $Si_{1-x}Ge_x$ where x is between 0.01 and 0.99; b) heating said pillars at a first temperature from approximately 430° C. to approximately 700° C. for between approximately 60 minutes and approximately 24 hours; and then c) heating said pillars at a second temperature from approximately 550° C. to approximately 850° C. for up to approximately 120 seconds, the monolithic three dimensional memory array comprising a first memory level monolithically formed above a substrate and a second memory level monolithically formed above the first memory level.

Another aspect of the invention provides for a method for forming a p-i-n diode, the method comprising the sequential steps of: a) first forming amorphous semiconductor pillars, the pillars comprising an alloy of silicon and germanium; b) then heating said pillars at a first temperature for at least 30 minutes; and c) then heating said pillars at a second temperature higher than the first temperature for no more than 120 seconds.

Another embodiment of the present invention provides for a method for forming a monolithic three dimensional memory array, the method comprising: a) forming amorphous semiconductor pillars, the pillars comprising an alloy of silicon and germanium; b) heating said pillars at a first temperature for at least 30 minutes; and c) heating said pillars at a second temperature higher than the first temperature of said alloy for no more than 120 seconds, the monolithic three dimensional memory array comprising a first memory level monolithically formed above a substrate and a second memory level monolithically formed above the first memory level.

Each of the aspects and embodiments of the invention described herein can be used alone or in combination with one another.

The preferred aspects and embodiments will now be described with reference to the attached drawings.

DETAILED DESCRIPTION OF THE INVENTION

A semiconductor junction diode, for example a p-n diode or a p-i-n diode, has been paired with a dielectric antifuse layer to form a memory cell, for example in the monolithic three dimensional memory array described in the '470 application.

The term junction diode is used herein to refer to a semiconductor device with the property of conducting current more easily in one direction than the other, having two terminal electrodes, and made of semiconducting material which is p-type at one electrode and n-type at the other. Examples include p-n diodes, which have p-type semiconductor material and n-type semiconductor material in contact, and p-i-n diodes, in which intrinsic (undoped) semiconductor material is interposed between p-type semiconductor material and n-type semiconductor material.

Figure 1:
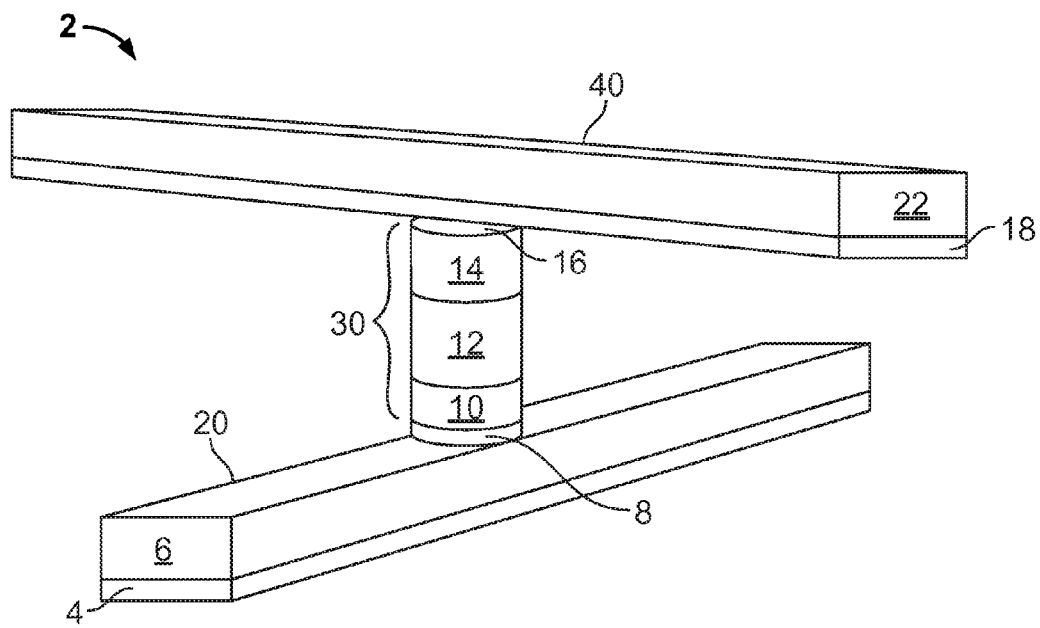
FIG. 1 is a perspective view of a memory cell comprising a vertically oriented junction diode disposed between top and bottom conductors.
Figure 2A:
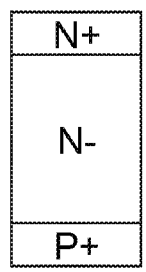
FIGS. 2A-2D are cross-sectional views of possible electrical configurations for junction diodes.
Figure 2B:
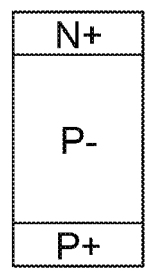
Figure 2C:
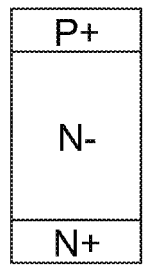
Figure 2D:
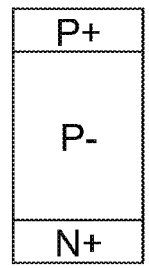

A preferred memory cell of the subject application includes a vertically oriented junction diode disposed between conductors; in some embodiments the cell will further have a dielectric antifuse layer interposed between the junction diode and one of the conductors. A memory cell 2 according to the subject application is shown in FIG. 1. A first conductor 20 preferably comprises titanium nitride layer 4 and tungsten layer 6. Junction diode 30 is formed on optional titanium nitride barrier layer 8 and comprises heavily doped semiconductor layer 10 of a first conductivity type, layer 12 which is undoped semiconductor material or lightly doped semiconductor material, and heavily doped semiconductor layer 14 of the second conductivity type. A thin silicon dioxide antifuse layer 16 may be formed on top of the junction diode 30. Second conductor 40 preferably comprises titanium nitride layer 18 and tungsten layer 22.

The memory cell 2 is unprogrammed when antifuse layer 16 is intact. To program the cell, a voltage sufficient to cause breakdown of the antifuse material is applied across antifuse layer 16. It is advantageous to maximize the difference in current between an unprogrammed cell and a programmed cell.

In general, the diodes of the subject application may take one of four basic configurations as depicted in FIGS. 2A-2D. The top and bottom regions are always heavily doped and have opposite conductivity types: either the bottom region is N+ and the top region is P+ or the bottom region is P+ and the top region is N+. These heavily doped regions provide good ohmic contact to the adjacent conductors.

The middle lightly doped or intrinsic region is interposed between and in contact with the top and bottom heavily doped regions. Even when this region is deposited with no intentional doping, it will always behave as though it is slightly n- or p-type, possibly due to contaminants or defects.

Thus the four electrical configurations as determined by dopant types and concentrations are: P+ at the bottom, N− in the middle, N+ at the top (shown in FIG. 2A); P+ at the bottom, P− in the middle, N+ at the top (shown in FIG. 2B); N+ at the bottom, N− in the middle, P+ at the top (shown in FIG. 2C); and N+ at the bottom, P− in the middle, P+ at the top (shown in FIG. 2D).

Variations of the same diode are described in the '470 application and in Petti et al., U.S. Pat. No. 6,946,719, "Semiconductor Device Including Junction Diode Contacting Contact-Antifuse Unit Comprising Silicide, hereinafter the '719 patent, hereby incorporated by reference. Varied terminology is used in the '470 application and the '719 patent: A diode which is P+ at the bottom, N− in the middle, and N+ at the top may be described either as a P+N− diode having an N+ ohmic contact or as a p-i-n diode (the N− portion having been deposited with no intentional doping.) The diodes are the same, and the difference is purely semantic. The term "junction diode" is intended to be inclusive.

In the subject application, a silicon-germanium alloy forms all three regions of the diode. The ratio of silicon to germanium in the alloy may be constant throughout the diode, or may be different in different portions. Carrier mobility is higher in germanium than in silicon; thus forward current is higher for the same potential when such a germanium alloy is used. A silicon-germanium alloy is the subject of the present application.

Silicon and germanium are fully miscible and can be blended in any proportion. Conductivity characteristics of the resulting alloy tend to be between those of pure silicon and pure germanium; thus a $Si_{0.8}Ge_{0.2}$ alloy, which is 80 atomic percent (at %) silicon and 20 at % Ge will have somewhat higher carrier mobility than pure silicon. Increasing germanium content to, for example, $Si_{0.5}Ge_{0.5}$ will improve carrier mobility further, while still not reaching that of pure germanium.

Figure 3:
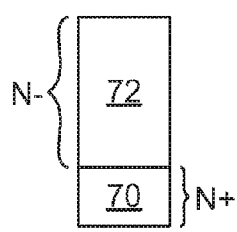
FIG. 3 is a cross-sectional view of portions of a junction diode.

N− and p-type dopants are typically added to semiconductors used in semiconductor devices to increase the conductivity of the semiconductor. An additional difficulty in the use of germanium is the relatively high diffusivity of n-type dopants (e.g. phosphorous) in germanium compared to silicon. Turning to FIG. 3, if a diode is formed in germanium having a heavily doped n-type region 70 adjacent to a region 72 with a different dopant concentration, for example a lightly doped or intrinsic region, there is danger that subsequent exposure to high temperature will cause the dopants in heavily doped region 70 to diffuse into lightly doped region 72, effectively mitigating the desired doping concentration difference and compromising the device.

When used to form a diode, an alloy of silicon and germanium can provide higher forward and reverse currents than silicon. It is desirable to minimize the reverse current and maximize the forward current. The higher leakage current across the diode under reverse bias when the diode is formed of a silicon-germanium alloy is undesirable, however. The two-step anneal sequence of the subject invention, as will be described, has been found to minimize the reverse leakage current under reverse bias while maximizing the forward current of a $Si_{1-x}Ge_x$ diode.

Examples will be given of several embodiments of the present invention. Detailed information regarding materials, process steps and dimensions will be provided, but it will be apparent to those skilled in the art that many of these details can be modified, added, or omitted while the result falls within the scope of the invention.

Some of the methods and details described here by way of illustration are described more fully in the '470 application. Useful information will also be found in Herner et al., U.S. Pat. No. 7,224,013, "Junction Diode Comprising Varying Semiconductor Compositions," hereinafter the '013 patent and hereby incorporated by reference. For simplicity, not all of the details of the '470 application and the '013 patent are reproduced in this description, but no teaching of these applications is intended to be excluded.

Figure 4A:
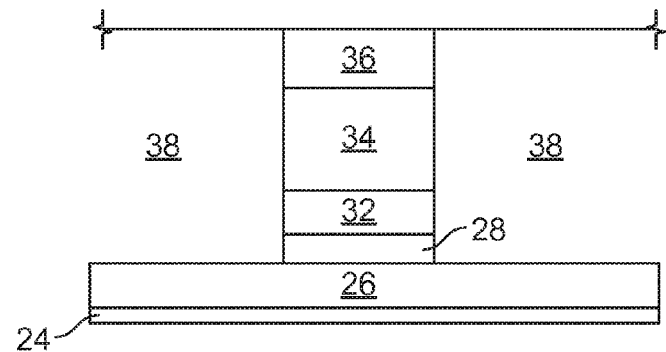
FIGS. 4A and 4B are cross-sectional views illustrating the formation of a memory cell according to the present invention.

Turning to FIG. 4A, formation of a memory level begins as in the '470 application. Fabrication begins on a suitable substrate (a monocrystalline silicon substrate, for example); typically a dielectric layer is formed over the substrate. The substrate and dielectric layer are not shown. Layers of titanium nitride 24 and tungsten 26 are deposited, then patterned and etched to form substantially parallel conductors, shown extending across the page. Dielectric fill (not shown) is deposited between and over the conductors, then planarized, for example by chemical-mechanical polishing (CMP) or etchback to expose the tungsten 26 of the conductors.

A thin barrier layer 28, preferably of titanium nitride, is optionally formed next on the conductors and fill. This barrier layer prevents reaction between the tungsten of the conductors and the semiconductor to be deposited above it.

Next, amorphous semiconductor material is deposited which will eventually form vertically oriented pillar-shaped diodes. As noted earlier, this diode may take one of four electrical configurations. For simplicity, this description will discuss just one: n+ on the bottom, intrinsic in the middle, p+ on top. Depending on deposition conditions, in some embodiments, intrinsic silicon-germanium may behave as if lightly n-doped. It will be understood that any of the four electrical configurations can be made by choosing appropriate dopant types and concentrations. In general, p-type dopants enhance crystallization. In the present invention, deposition temperatures are chosen that are low enough to deposit amorphous semiconductor films, when the films are lightly n- or p-type doped, or heavily n-type doped. Heavily p-type in situ doped silicon, silicon-germanium, or germanium tends to be polycrystalline as deposited, even at low deposition temperatures. The semiconductor films that are deposited in the amorphous state require a subsequent thermal anneal to complete crystallization. In the present example, the first layer of silicon-germanium in the subject invention is doped with an n-type dopant, such as antimony, arsenic, or phosphorus.

In this example, a first layer 32 of about 100 to about 800 angstroms, for example about 200 angstroms of in situ $Si_{0.8}Ge_{0.2}$ doped with phosphorus is deposited to form an n-type silicon-germanium layer which is entirely or predominantly amorphous as deposited. This first layer 32 is preferably heavily doped, with a dopant concentration of about $1 \times 10^{19}$ to about $2 \times 10^{21}$ atoms/cm$^3$, preferably about $8 \times 10^{20}$ atoms/cm$^3$. Any conventional source gases can be flowed to provide the silicon and germanium atoms, for example $SiH_4$, $Si_2H_6$, or dichlorosilane to provide silicon, and $GeH_4$ to provide germanium. In general, in the preparation of a $Si_{1-x}Ge_x$ layer, the exact composition is a function of the deposition temperature and source gas concentration. Thus the $GeH_4/(SiH_4+GeH_4)$ ratio (in one example) can range from 0.02 to 0.5, and the source gases can be flowed at the temperature ranges discussed herein. Those skilled in the art will recognize that different flow rates and compositions at different temperatures for different lengths of time will affect the thickness and composition of the layers being grown, and annealed. It would also be possible for layer 32 to be deposited without doping, in which case it would be amorphous as desired, and then doped by ion implantation.

Next about 3300 angstroms of intrinsic $Si_{0.8}Ge_{0.2}$ is deposited to form layer 34. This region of the diode is deposited with no added dopant, and generally will behave as if slightly n-type. If desired, this region can be lightly doped with n-type dopants. While $SiH_4$ and $GeH_4$, are used as source gases in this example, any conventional source gas can be flowed to provide the germanium atoms.

Up to about 600 angstroms of silicon-germanium will be removed by a subsequent planarization step.

The result is a $Si_{0.8}Ge_{0.2}$ stack. This stack, including layers 34 and 32, is patterned and etched using conventional photolithography and etch techniques to form a plurality of evenly spaced substantially vertical pillars separated by gaps. Each pillar is disposed substantially on an underlying conductor. Some misalignment can be tolerated.

The gaps between the pillars are filled with a dielectric material 38 deposited between and over the pillars. Planarization, for example by CMP or etchback, is performed to expose the tops of the pillars. Ion implantation with p-type dopants is performed after planarization to heavily dope the silicon at the top of the pillar, creating heavily doped region 36, which may be about 100 to about 800 angstroms thick, for example about 200 angstroms thick. In other embodiments, the top region of the pillar could have been in situ doped with p-type dopants during deposition instead of being doped by implantation. FIG. 4A shows the structure at this point.

As described in Herner et al., U.S. patent application Ser. No. 10/955,549, "Nonvolatile Memory Cell Without a Dielectric Antifuse Having High- and Low-Impedance States," filed Sep. 29, 2004; and in Herner et al., U.S. patent application Ser. No. 11/148,530, "Nonvolatile Memory Cell Operating by Increasing Order in Polycrystalline Semiconductor Material," filed Jan. 8, 2005, both hereby incorporated by reference, the semiconductor diodes just described are formed of semiconductor material in an initial high-impedance state. When exposed to a programming voltage, the semiconductor material of the diodes is converted to a low-impedance state.

Thus the silicon-germanium of the diode is not substantially conductive as formed after crystallization, and will be converted to a low-impedance state by a subsequent programming pulse. This change in the semiconductor material from a high-impedance to a low-impedance state may serve as the basis of the memory cell and thus formation of a dielectric rupture antifuse layer is optional. Application of a programming voltage between the bottom conductor and the top conductor yet to be formed will cause dielectric rupture of the antifuse layer, if present, and will convert the polycrystalline silicon-germanium of the diode to a low-impedance state.

If an antifuse is to be formed, it should be formed at this point, preferably by deposition at a temperature low enough to avoid crystallizing the silicon-germanium of regions 32, 34, and 36 of the diode. The dielectric rupture antifuse layer can be a deposited dielectric such as a $HfO_2$ layer. For example, $HfO_2$ can be deposited at 300° C., which maintains all layers in the amorphous state and limits dopant diffusion, thereby maintaining the thickness of undoped region 34 and limiting reverse leakage. Alternatively, a higher dielectric antifuse film is deposited before deposition of the silicon-germanium making up the diode.

Figure 4B:
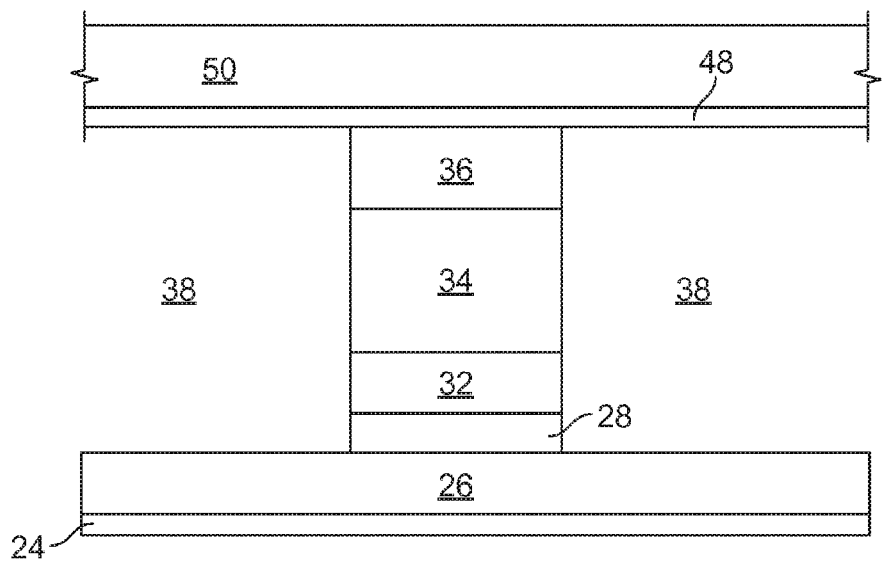

Continuing to FIG. 4B, an adhesion layer 48 is deposited, preferably 200 angstroms of conductive material, such as titanium nitride. Tantalum nitride, tungsten nitride, tantalum, or titanium tungsten can be substituted for titanium nitride. In FIG. 4B, the optional dielectric rupture antifuse layer is not shown.

An appropriate thickness, for example about 1700 angstroms of tungsten 50 is deposited on titanium nitride layer 48, then the tungsten and titanium nitride layers are patterned and etched to form substantially parallel evenly spaced second conductors. The second conductors are preferably substantially perpendicular to the first conductors. The junction diode is preferably aligned at the intersection of the vertical projections of the first conductor below it and the second conductor above it, but some misalignment can be tolerated.

The first (bottom) conductors, junction diodes, and second (top) conductors form a first memory level. Another memory level can be monolithically formed above this first memory level. A second level of junction diodes can be formed on the second conductors, for example. Third conductors can be formed above the second level of junction diodes to complete a second memory level. The third conductors will preferably extend in substantially the same direction as the first conductors. The second conductors act as the top conductors of the first memory level and the bottom conductors of the second memory level. Fabrication can be employed to form additional memory levels.

Alternatively, in other embodiments, conductors may not be shared, and an interlevel dielectric may separate adjacent memory levels.

In the example just described, the silicon-germanium of layers 32, 34, and 36 is deposited substantially amorphous, and must be annealed at a higher temperature to crystallize it. The crystallizing anneal is preferably performed after fabrication of all memory levels is complete.

Figure 5:
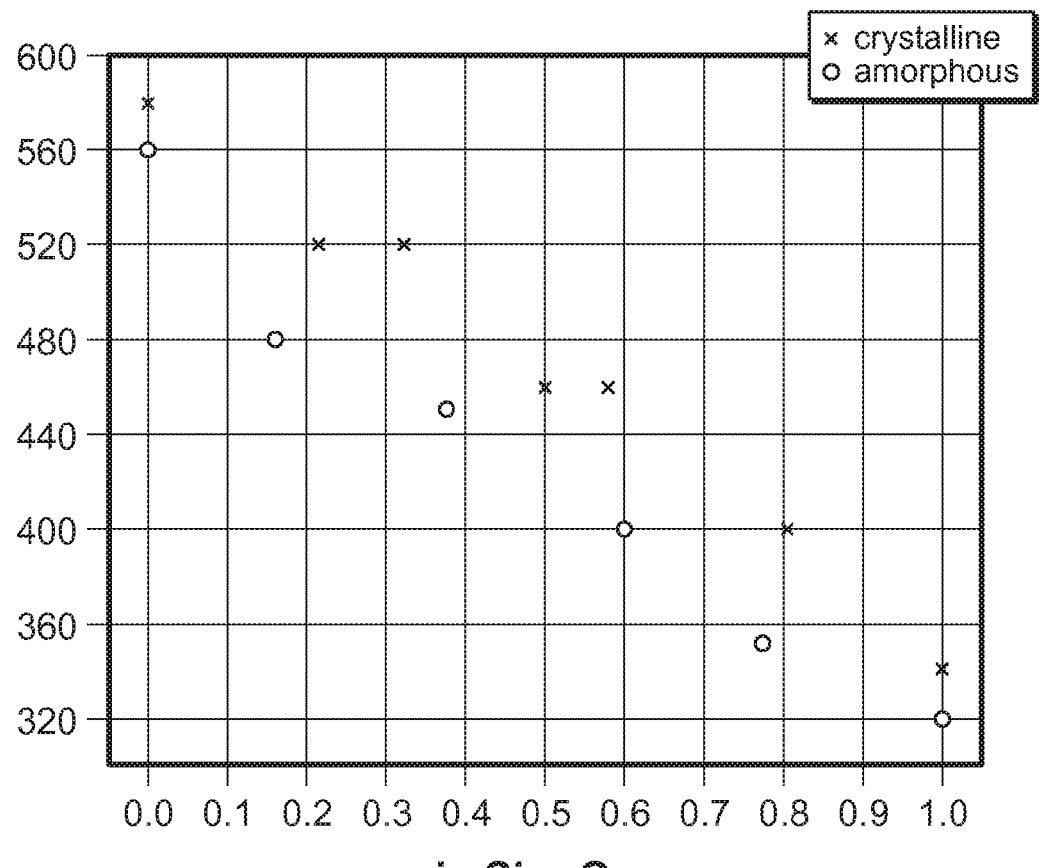
FIG. 5 is a graph showing the crystallization transition temperatures during the deposition of $Si_{1-x}Ge_x$ alloys.
Figure 6:
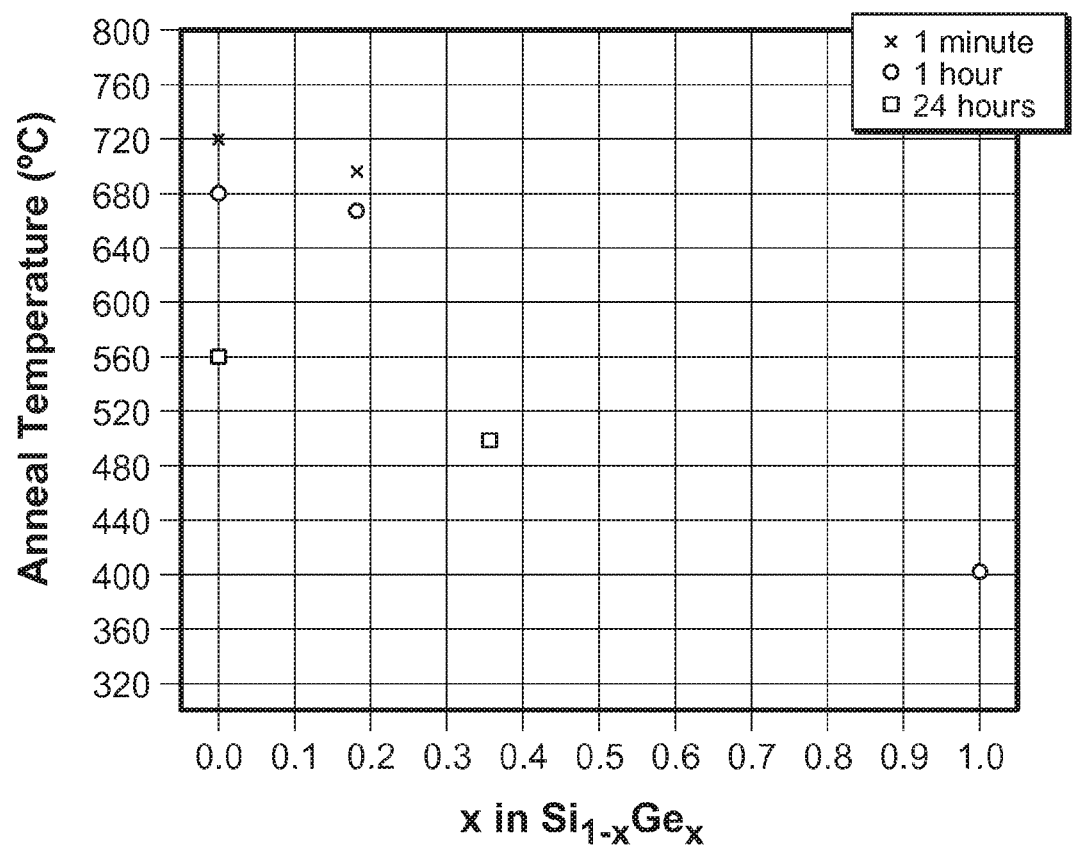
FIG. 6 is a graph showing the anneal time and temperature needed to crystallize amorphous $Si_{1-x}Ge_x$ alloys with a single anneal.

A high temperature anneal can have unfortunate side effects, including unwanted dopant diffusion and peeling of, for example, metal or silicon dioxide layers or elements caused by differential expansion and contraction of unlike materials when heated and cooled. A germanium or a silicon-germanium alloy region will crystallize at a lower temperature than will a silicon-only region This is shown graphically in FIG. 5, where the transition temperature in the deposition of the silicon-germanium layer from amorphous (o) to partially crystalline (x) is shown to decrease as the germanium content in $Si_{1-x}Ge_x$ increases. FIG. 6 shows that the temperature required when annealing to achieve complete crystallization of all devices of amorphous $Si_{1-x}Ge_x$ for a given period of time decreases as germanium content increases. Therefore it is seen that increasing the germanium content of a silicon-germanium alloy decreases the temperature at which crystallization of the alloy will occur. However, the addition of germanium typically also increases current through the diode under both forward and reverse bias.

For a memory cell it is preferred to maximize the difference between programmed and unprogrammed current. Such a difference allows the programmed and unprogrammed states of the cell to be reliably distinguishable and provides for as wide a margin as possible for variations in manufacturing and operation. Clearly a larger difference between the programmed and the unprogrammed current makes reliable sensing of the state of the cell easier. It is also highly desirable to have a low reverse bias leakage for these memory cells to minimize the current required when programming large arrays.

Figure 7:
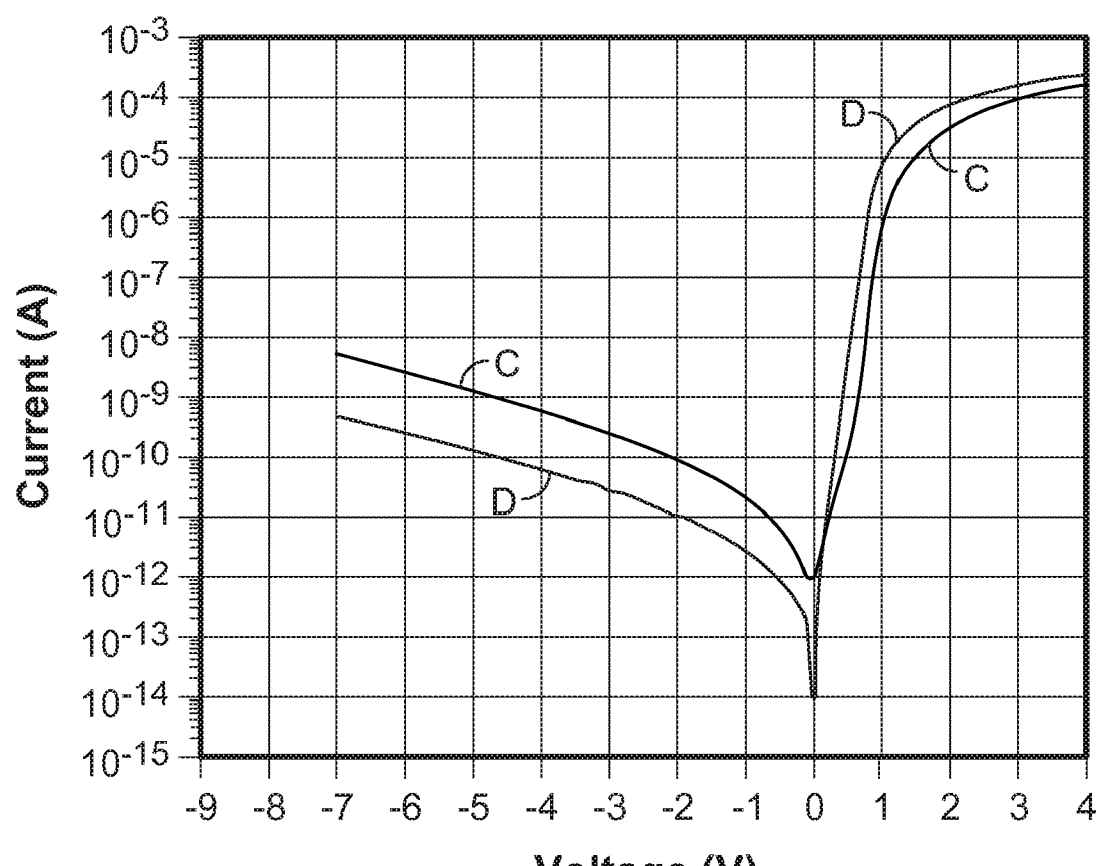
FIG. 7 is a chart showing reverse current vs. voltage data for the anneal sequence of the subject invention, compared with a single anneal procedure.

Aspects of the present invention provide for a two-step anneal process that results in reduced current in reverse bias compared to a one-step anneal. The silicon-germanium of the p-i-n diode is deposited in an amorphous state and then crystallized by this two-step annealing process. The p-i-n diode is subjected to a first lower temperature for a longer time and then heated at a higher temperature for a short time. Current-voltage curves for vertical SiGe diodes which have undergone either a one-step or two-step crystallization anneal are shown in FIG. 7. The diode annealed in a two-step anneal is shown to have lower reverse current and higher forward current (curve D) compared to the diode annealed in a one-step anneal (curve C). The resulting current leakage is shown in FIG. 7 to be minimized and the forward current maximized, with the anneal sequence of C (one-step anneal) and D (two-step anneal) compared. It will be seen that at negative voltage (with the diode under reverse bias) the undesirable reverse current D is lower for the diode crystallized by the two-step anneal of the present invention, while at positive voltage (with the diode under forward bias) the forward current D is higher for the diode crystallized by a two-step anneal.

While not wishing to be bound by any one theory, it is believed that the first anneal of the two-step anneal, which is a longer-time, lower-temperature furnace anneal, slowly crystallizes the amorphous silicon-germanium. The result is larger silicon-germanium grains when compared to a fast crystallization rate. A slow crystallization anneal results in fewer nucleation sites, so a nucleating grain can grow larger before contacting a neighboring grain. Grain boundaries are defect sites which can increase the reverse leakage of the diode and therefore larger grains are better. The second anneal, which is a shorter-time, higher-temperature furnace anneal, decreases the density of interior grain defects such as microtwins, which are known electrically active defects. This two-step anneal should minimize two contributors to reverse leakage: grain boundaries and intragrain defects which can increase reverse leakage of the diode, and thereby decrease reverse leakage while maintaining a high forward current.

Figure 8:
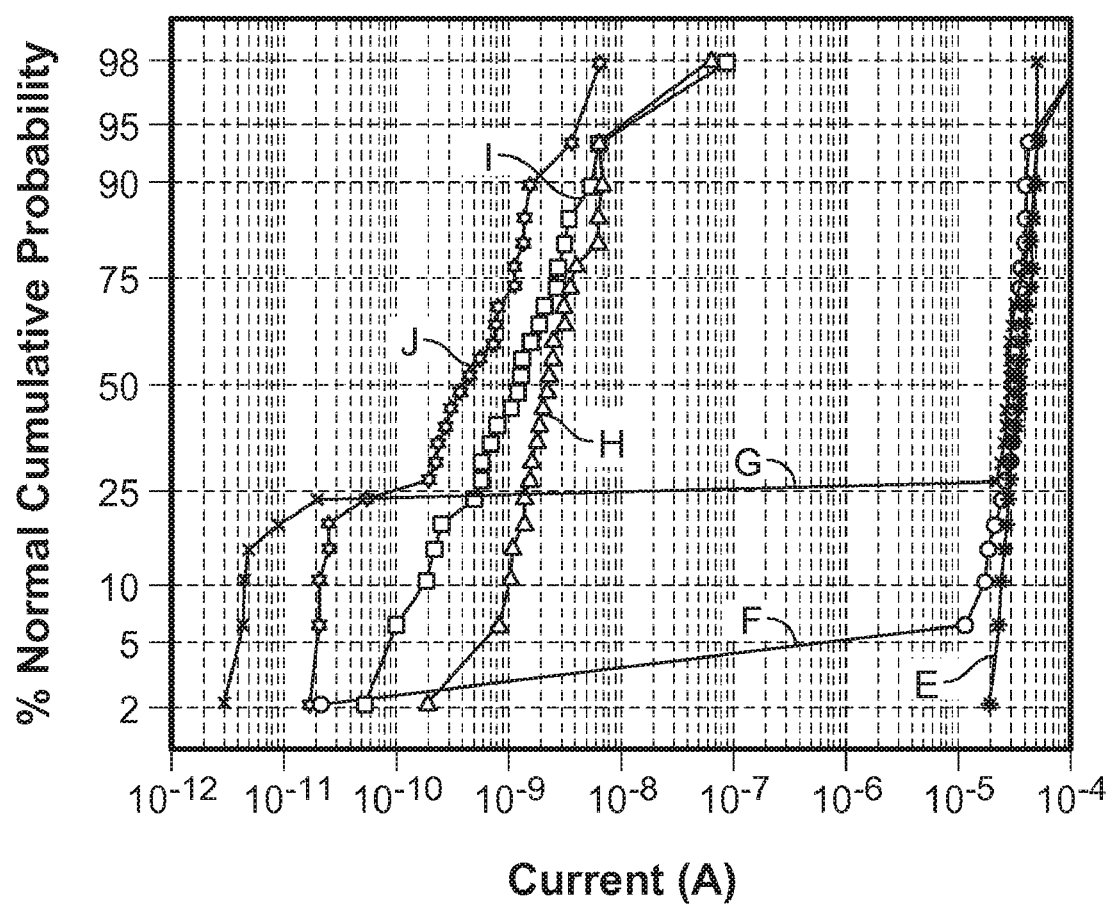
FIG. 8 is a probability plot showing current in memory cells utilizing the anneal sequence of the subject invention and also in memory cells utilizing only a single anneal procedure.

Many amorphous diodes made of $Si_{0.8}Ge_{0.2}$ pillars were subjected to various crystallization anneals, and the reverse current at −6.5 volts and the forward current at +2 volts were measured. FIG. 8 is a probability plot of these measurements. The following anneal conditions were used on samples 1, 2, and 3:

| | Reverse Current | Forward Current | Annealing Conditions |
|---|---|---|---|
| 1. | H | E | 700° C. for 60 sec |
| 2. | I | F | 670° C. for 60 min |
| 3. | J | G | 670° C. for 60 min and 800° C. for 15 sec. |

FIG. 8 depicts the forward current for samples 1, 2, and 3 with plots E, F, and G for a programmed diode when a read voltage of 2 volts is applied, and the reverse current for the same three samples are shown in plots H, I, and J. As can be seen, the difference between forward and reverse current is maximized for sample 3, the diode subjected to the two-step anneal. The reverse current is minimized and the forward current is maximized with the two-step anneal compared to the one-step anneal, as shown by FIG. 8.

With the method of annealing of the subject invention, the initial heating step for a pillar of $Si_{1-x}Ge_x$, where x is between 0.01 and 0.99, should be from approximately 350° C. to approximately 625° C. for a period of time of at least 30 minutes to 48 hours, and preferably 1 to 24 hours, and most preferably 1 hour at 550° C. -700° C. or 24 hours at 450° C. -600° C. The second heating step should be from approximately 550° C. to approximately 850° C., preferably for a period of time up to about 120 sec., preferably from 1 second to 30 seconds, for example 10 seconds at 650° C. to 750° C. or 15 seconds at 700° C. to 900° C. The preferred silicon-germanium alloy is $Si_{1-x}Ge_x$ where x is between about 0.01 and about 0.99, preferably between about 0.1 and about 0.5, for example x may be about 0.2 or about 0.4.

To show the breadth of the subject invention, the following examples are presented which show preferred ranges of composition of $Si_{1-x}Ge_x$ (x=0.01→0.99) pillars and a preferred anneal sequence for each:

TABLE

| Composition | 1$^{st}$ Anneal Temp. | 1$^{st}$ Anneal Time (Hours) | 2$^{nd}$ Temp. | 2$^{nd}$ Time (Sec.) |
|---|---|---|---|---|
| 1. $Si_{1-x}Ge_x$ $0.01 < x < 0.2$ | 650° C. ± 25° C. | 1 | 800° C. ± 50° C. | 10 |
| 2. $Si_{1-x}Ge_x$ $0.01 < x < 0.2$ | 540° C. ± 20° C. | 24 | 800° C. ± 50° C. | 10 |
| 3. $Si_{1-x}Ge_x$ $0.01 < x < 0.2$ | 650° C. ± 25° C. | 1 | 800° C. ± 50° C. | 120 |
| 4. $Si_{1-x}Ge_x$ $0.01 < x < 0.2$ | 540° C. ± 20° C. | 24 | 800° C. ± 50° C. | 120 |
| 5. $Si_{1-x}Ge_x$ $0.2 < x < 0.4$ | 590° C. ± 25° C. | 1 | 750° C. ± 50° C. | 10 |
| 6. $Si_{1-x}Ge_x$ | 500° C. ± 20° C. | 24 | 750° C. ± 50° C. | 10 |

TABLE-continued

| Composition | 1st Anneal Temp. | 1st Anneal Time (Hours) | 2nd Temp. | 2nd Time (Sec.) |
|---|---|---|---|---|
| 7. $Si_{1-x}Ge_x$ $0.2 < x < 0.4$ | 590° C. ± 25° C. | 1 | 750° C. ± 50° C. | 120 |
| 8. $Si_{1-x}Ge_x$ $0.2 < x < 0.4$ | 500° C. ± 20° C. | 24 | 750° C. ± 50° C. | 120 |
| 9. $Si_{1-x}Ge_x$ $0.4 < x < 0.6$ | 540° C. ± 25° C. | 1 | 700° C. ± 50° C. | 10 |
| 10. $Si_{1-x}Ge_x$ $0.4 < x < 0.6$ | 460° C. ± 20° C. | 24 | 700° C. ± 50° C. | 10 |
| 11. $Si_{1-x}Ge_x$ $0.4 < x < 0.6$ | 540° C. ± 25° C. | 1 | 700° C. ± 50° C. | 120 |
| 12. $Si_{1-x}Ge_x$ $0.4 < x < 0.6$ | 460° C. ± 20° C. | 24 | 700° C. ± 50° C. | 120 |
| 13. $Si_{1-x}Ge_x$ $0.6 < x < 0.8$ | 480° C. ± 25° C. | 1 | 650° C. ± 50° C. | 10 |
| 14. $Si_{1-x}Ge_x$ $0.6 < x < 0.8$ | 420° C. ± 20° C. | 24 | 650° C. ± 50° C. | 10 |
| 15. $Si_{1-x}Ge_x$ $0.6 < x < 0.8$ | 480° C. ± 25° C. | 1 | 650° C. ± 50° C. | 120 |
| 16. $Si_{1-x}Ge_x$ $0.6 < x < 0.8$ | 420° C. ± 20° C. | 24 | 650° C. ± 50° C. | 120 |
| 17. $Si_{1-x}Ge_x$ $0.8 < x < 0.99$ | 430° C. ± 25° C. | 1 | 600° C. ± 50° C. | 10 |
| 18. $Si_{1-x}Ge_x$ $0.8 < x < 0.99$ | 370° C. ± 20° C. | 24 | 600° C. ± 50° C. | 10 |
| 19. $Si_{1-x}Ge_x$ $0.8 < x < 0.99$ | 430° C. ± 25° C. | 1 | 600° C. ± 50° C. | 120 |
| 20. $Si_{1-x}Ge_x$ $0.8 < x < 0.99$ | 370° C. ± 20° C. | 24 | 600° C. ± 50° C. | 120 |

The anneal sequence set forth above in the Table can be seen to heat the silicon-germanium diodes in a sequence that includes a first step of heating at a lower temperature for a relatively long period of time, i.e., from 1 to 24 hours at temperatures from 350° C. to 700° C., depending on the particular silicon-germanium alloy composition. The specific anneal sequences presented in this table are examples only.

In a second step, the silicon-germanium diode is annealed at a higher temperature for a relatively short time, i.e., 10 to 120 seconds, at a temperature from 550° C. to 900° C., depending on the particular silicon-germanium alloy composition.

Preferred is a heating sequence for a diode having the composition $Si_{1-x}Ge_x$ where x is between 0.01 and 0.3, wherein the heating sequence is either at 480° C. to 560° C. for 24 hours, or 565° C,-675° C. for 1 hour as a first step, and as a second step, 700° C. to 850° C. for 10-120 seconds.

In one embodiment a pillar having the composition $Si_{0.8}Ge_{0.2}$ is annealed at 600° C. for 1 hour or 500°-540° for 24 hrs. and then at 750° C. for 10-120 seconds.

With this two-step heating and annealing sequence, applicant has maximized forward current and minimized reverse current, as compared to a single annealing step. If this two-step annealing sequence is performed after fabrication of all of the memory levels of the three dimensional array is complete, care must be taken to make sure that no fabrication step takes place at a temperature that rises above the crystallization temperature for the silicon-germanium alloy being used.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method for forming a junction diode, the method comprising:
   a) forming semiconductor pillars, the pillars comprising an amorphous alloy of silicon and germanium;
   b) heating said pillars at a first temperature for at least 30 minutes; and
   c) heating said pillars at a second temperature, wherein the second temperature is higher than the first temperature, for about 120 seconds or less;
   wherein the step of heating the pillars at the first temperature is conducted at a temperature of about 675° C. to about 700° C.

2. The method of claim 1, wherein the step of heating the pillars at the first temperature is approximately 670° C. for approximately 60 minutes.

3. The method of claim 1, wherein the alloy comprises $Si_{1-x}Ge_x$ where x is between 0.01 and 0.99.

4. The method of claim 1, wherein the alloy is $Si_{1-x}Ge_x$, where x is about 2.0.

5. The method of claim 1, wherein the step of heating said pillars at the first temperature is conducted for at least 60 minutes.

6. A method for forming a junction diode, the method comprising:
   a) forming semiconductor pillars, the pillars comprising an amorphous alloy of silicon and germanium;
   b) heating said pillars at a first temperature for at least 30 minutes; and
   c) heating said pillars at a second temperature, wherein the second temperature is higher than the first temperature, for about 120 seconds or less;
   wherein the step of heating the pillars at the second temperature is conducted at a temperature of about 550° C. to about 850° C. for up to about 120 seconds.

7. The method of claim 6, wherein the step of heating the pillars at the second temperature is conducted at approximately 800° C. for about 10 to about 120 seconds.

8. The method of claim 6, wherein the alloy is $Si_{1-x}Ge_x$ where x is between 0.01 and 0.99.

9. The method of claim 6, wherein the alloy is approximately $Si_{0.8}Ge_{0.2}$.

10. The method of claim 6, wherein the step of heating said pillars at the first temperature is conducted for at least 60 minutes.

11. A method for forming a monolithic three dimensional memory array, the method comprising:
    a) forming semiconductor pillars comprising $Si_{1-x}Ge_x$ where x is between 0.01 and 0.99;
    b) heating said pillars at a first temperature from approximately 430° C. to approximately 700° C. for between approximately 60 minutes and approximately 24 hours; and then
    c) heating said pillars at a second temperature from approximately 550° C. to approximately 850° C. for up to approximately 120 seconds,
    the monolithic three dimensional memory array comprising a first memory level monolithically formed above a substrate and a second memory level monolithically formed above the first memory level.

12. The method of claim 11 wherein the substrate comprises monocrystalline silicon.

13. The method of claim 11 wherein each semiconductor pillar comprises a p-i-n diode.

14. A method for forming a p-i-n diode, the method comprising the sequential steps of:
    a) first forming amorphous semiconductor pillars, the pillars comprising an alloy of silicon and germanium;
    b) then heating said pillars at a first temperature for at least 30 minutes; and
    c) then heating said pillars at a second temperature higher than the first temperature for no more than 120 seconds;
    wherein the step of heating said pillars at the first temperature is conducted for at least 60 minutes; and
    wherein the step of heating said pillars at the first temperature is conducted at a temperature of about 375° C. to about 625° C.

15. The method of claim 14, wherein the alloy is $Si_{1-x}Ge_{x1}$ where x is between 0.01 and 0.99.

16. The method of claim 14, wherein the alloy is approximately $Si_{0.8}Ge_{0.2}$.

17. A method for forming a p-i-n diode, the method comprising the sequential steps of:
    a) first forming amorphous semiconductor pillars, the pillars comprising an alloy of silicon and germanium;
    b) then heating said pillars at a first temperature for at least 30 minutes; and
    c) then heating said pillars at a second temperature higher than the first temperature for no more than 120 seconds;
    wherein the step of heating said pillars at the first temperature is conducted for at least 60 minutes; and
    wherein the step of heating the pillars at the second temperature is conducted at a temperature of about 500° C. to about 850° C. for up to about 120 seconds.

18. The method of claim 17, wherein the alloy is $Si_{1-x}Ge_x$ where x is between 0.01 and 0.99.

19. The method of claim 17, wherein the alloy is approximately $Si_{0.8}Ge_{0.2}$.

20. A method for forming a monolithic three dimensional memory array, the method comprising:
    a) forming amorphous semiconductor pillars, the pillars comprising an alloy of silicon and germanium;
    b) heating said pillars at a first temperature for at least 30 minutes; and
    c) heating said pillars at a second temperature higher than the first temperature of said alloy for no more than 120 seconds,
    the monolithic three dimensional memory array comprising a first memory level monolithically formed above a substrate and a second memory level monolithically formed above the first memory level;
    wherein the step of heating the pillars at the first temperature is conducted at a temperature of about 375° C. to about 670° C.

21. The method of claim 20, wherein the alloy is $Si_{1-x}Ge_x$ where x is between 0.01 and 0.99.

22. The method of claim 20, wherein the alloy is approximately $Si_{0.8}Ge_{0.2}$.

23. The method of claim 20, wherein the step of heating said pillars at the first temperature is conducted for at least 60 minutes.

24. A method for forming a monolithic three dimensional memory array, the method comprising:
    a) forming amorphous semiconductor pillars, the pillars comprising an alloy of silicon and germanium;
    b) heating said pillars at a first temperature for at least 30 minutes; and
    c) heating said pillars at a second temperature higher than the first temperature of said alloy for no more than 120 seconds,
    the monolithic three dimensional memory array comprising a first memory level monolithically formed above a substrate and a second memory level monolithically formed above the first memory level;
    wherein the step of heating the pillars at the second temperature is conducted at a temperature of about 550° C. to about 850° C. for about 10 to about 120 seconds.

25. The method of claim 24, wherein the alloy is $Si_{1-x}Ge_x$ where x is between 0.01 and 0.99.

26. The method of claim 24, wherein the alloy is approximately $Si_{0.8}Ge_{0.2}$.

27. The method of claim 24, wherein the step of heating said pillars at the first temperature is conducted for at least 60 minutes.

* * * * *